US012700853B2

(12) United States Patent
Chen

(10) Patent No.: US 12,700,853 B2
(45) Date of Patent: Aug. 4, 2026

(54) SET-TOLERANT COMPARATOR

(71) Applicant: TEXAS INSTRUMENTS INCORPORATED, Dallas, TX (US)

(72) Inventor: Aaron Chen, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 18/733,960

(22) Filed: Jun. 5, 2024

(65) Prior Publication Data

US 2025/0379560 A1 Dec. 11, 2025

(51) Int. Cl.
*H03K 3/0233* (2006.01)

(52) U.S. Cl.
CPC ..... *H03K 3/02337* (2013.01); *H03K 3/02335* (2013.01)

(58) Field of Classification Search
CPC ........... H03K 3/02337; H03K 3/02335; H03K 3/023; H03K 3/0233; H03K 5/2481; H03K 5/2472; G11C 7/062; G11C 7/06; G01R 19/0038
See application file for complete search history.

(56) References Cited

U.S. PATENT DOCUMENTS

2011/0210762 A1* 9/2011 Hirose ................... H04N 25/78
327/73

OTHER PUBLICATIONS

Texas Instruments. "TPS7H3014-SP Radiation-Hardness-Assured, 14V, 4-Channel Sequencer." Published Jan. 2024.

* cited by examiner

*Primary Examiner* — Jung Kim
(74) *Attorney, Agent, or Firm* — Zhenhai Fu; Frank D. Cimino

(57) ABSTRACT

A comparator includes a differential input, an output, a pair of first transistors coupled to the differential input, a pair of second transistors coupled to the output, and a SET protection circuit. Gate terminals of the pair of first transistors are coupled to the differential input of the comparator. The second terminals of the pair of second transistors are coupled to the second terminals of the pair of first transistors. The SET protection circuit has a current source and a transistor. The transistor of the SET protection circuit has a first terminal coupled to the body terminals of the pair of first transistors to bias the body terminals of the pair of first transistors separate from the first terminals of the pair of first transistors. A gate terminal of the transistor of the SET protection circuit is coupled to a terminal of the differential input of the comparator.

13 Claims, 10 Drawing Sheets

SET-TOLERANT COMPARATOR

BACKGROUND

Space craft, such as satellites, telescopes, or interplanetary spacecraft, can include integrated circuits that are subject to radiation and/or high-energy particles. In particular, integrated circuits in space craft may be subject to Single Event Transients (SETs) that occur when an ionizing radiation particle, such as an alpha particle or gamma ray, strikes the integrated circuit. The ionizing radiation particle imparts energy to the integrated circuit, often in the form of an unexpected "spike" or "dip" in the current and/or voltage within the integrated circuit. If left un-abated, these SETs can cause glitches in sensitive nodes of the circuit, and can cause the integrated circuit to malfunction.

SUMMARY

In some examples, a comparator includes a first input; a second input; an output. A first transistor of the comparator includes a first terminal, a second terminal, a gate terminal and a body terminal. The gate terminal of the first transistor is coupled to the first input of the comparator. A second transistor of the comparator includes a first terminal, a second terminal, a gate terminal and a body terminal. The body terminal of the second transistor is coupled to the body terminal of the first transistor, the first terminal of the first transistor is coupled to the first terminal of the second transistor, and the gate terminal of the second transistor is coupled to the second input of the comparator. A third transistor of the comparator includes a first terminal, a second terminal, and a control terminal. The second terminal of the third transistor is coupled to the second terminal of the first transistor. A fourth transistor of the comparator includes a first terminal, a second terminal, and a control terminal. The second terminal of the fourth transistor is coupled to the second terminal of the second transistor and is coupled to the output of the comparator. A fifth transistor of the comparator includes a first terminal, a second terminal, a gate terminal, and a body terminal. The gate terminal of the fifth transistor is coupled to the gate terminal of the first transistor, the first terminal of the fifth transistor is coupled to the body terminal of the fifth transistor, is coupled to the body terminal of the first transistor, and is coupled to the body terminal of the second transistor.

In some examples, a comparator has a differential input and an output. The comparator includes a first supply rail; a second supply rail. A pair of first transistors of the comparator each have a first terminal, a second terminal, a gate terminal, and a body terminal. The first terminals of the pair of first transistors are coupled to the first supply rail, and the gate terminals of the pair of first transistors are coupled to the differential input of the comparator. A pair of second transistors of the comparator each have a first terminal, a second terminal, a control terminal. The second terminals of the pair of second transistors are coupled to the second terminals of the pair of first transistors. The first terminals of the pair of second transistors are coupled to the second supply rail, and the second terminal of at least one of the pair of second transistors are coupled to the output of the comparator. A single event transient (SET) protection circuit includes a first terminal and a second terminal. The first terminal of the SET protection circuit is coupled to the body terminals of the pair of first transistors, and the second terminal of the SET protection circuit is coupled to the second supply rail.

In some examples, a comparator includes a differential input and an output. A first transistor of the comparator includes a first terminal, a second terminal, a gate terminal and a body terminal. The gate terminal of the first transistor is coupled to the differential input of the comparator. A second transistor of the comparator includes a first terminal, a second terminal, a gate terminal, and a body terminal. The body terminal of the second transistor is coupled to the body terminal of the first transistor. The first terminal of the first transistor is coupled to the first terminal of the second transistor, and the gate terminal of the second transistor is coupled to the differential input of the comparator. A third transistor of the comparator includes a first terminal, a second terminal, and a gate terminal. The second terminal of the third transistor is coupled to the second terminal of the first transistor. A fourth transistor includes a first terminal, a second terminal, and a gate terminal. The second terminal of the fourth transistor is coupled to the second terminal of the second transistor and is coupled to the output of the comparator. A single event transient (SET) protection circuit includes a transistor. The transistor of the SET protection circuit has a first terminal, a second terminal, a gate terminal, and a body terminal. The first terminal of the transistor of the SET protection circuit is coupled to the body terminal of the transistor of the SET protection circuit, is coupled to the body terminal of the first transistor, and is coupled to the body terminal of the second transistor. The SET protection circuit is configured to bias the body terminal of the first transistor and the body terminal of the second transistor independently from the first terminal of the first transistor and the first terminal of the second transistor.

DETAILED DESCRIPTION

The drawings are not drawn to scale.

Figure 1:
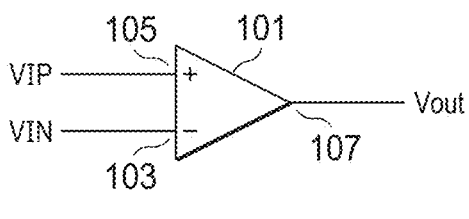
FIG. 1 is a circuit symbol of a comparator in accordance with some examples.

FIG. 1 depicts a comparator 101. The comparator 101 has a first input terminal 103, a second input terminal 105, and an output terminal 107. During operation, the comparator 101 compares a first signal (e.g., a voltage input positive (VIP)) on the first input terminal 103 with a second signal (e.g., a voltage input negative (VIN)) on the second input terminal 105, and provides an output signal (e.g., Vout) on output terminal 107 based on the comparison. For example, when a voltage level of VIN is less than or equal to a voltage level of VIP, then the output voltage is in a first state (e.g., a logical "0"). Conversely, when the voltage level of VIN is greater than the voltage level of VIP, then the voltage level of the output is in a second state (e.g., a logical "1"). Thus, the output signal represents a comparison result of the first and second input signals. Note that the convention of whether the output voltage is a logical "0" or a logical "1" is arbitrary, and could be flipped in other implementations. Accordingly, in other cases, when VIN is greater or equal to VIP, the output voltage can be a logical "0", whereas when VIN is less than VIP, the output voltage can be a logical "1".

However, when a Single Event Transient (SET) strikes one or more internal nodes within the comparator 101, the output state of the comparator can potentially deviate from this expected functionality. This can cause errors in the system. To mitigate the effects of SETs, some previous space craft include three comparators that each provide an independent comparison of the first and second input signals. The three comparators then each provide their output signal to voting circuitry. The voting circuitry then provides an output signal that tracks the output provided by the majority of the comparators. Thus, even if a SET strikes one of the comparators and causes that comparator to provide an erroneous output, the other two comparators (which are not struck by the SET) still provide a correct output. Although this architecture is generally sufficient to provide reliable outputs in high-radiation areas, having three comparators which are largely redundant consumes a relatively large amount of power during operation and consumes a large die area.

Accordingly, aspects of the present disclosure relate to a SET-tolerant comparator architecture that includes a SET protection circuit. The SET protection circuit enables a single comparator to provide a reliable output, even in the wake of a SET. The SET-tolerant comparator also consumes less power and less die area than previous approaches that had three comparators and voting circuitry.

Figure 2:
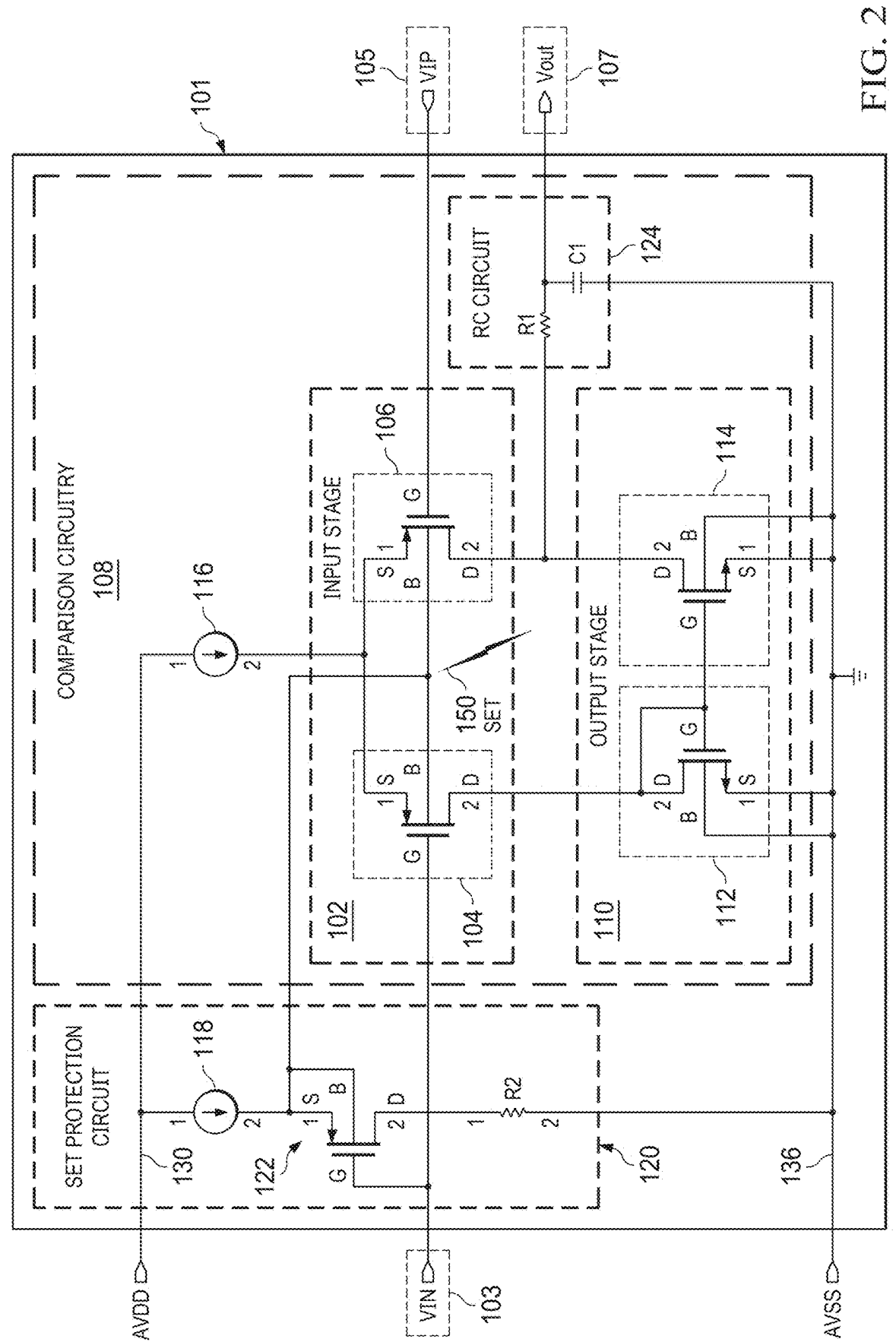
FIG. 2 is a circuit schematic of comparator that includes a SET protection circuit in accordance with some examples.

FIG. 2 is a circuit diagram of an example of a comparator 101 that includes a SET protection circuit 120. The comparator 101 has a first input terminal 103 (e.g., VIN terminal), a second input terminal 105 (e.g., VIP terminal), and an output terminal 107 (e.g., Vout). The comparator 101 includes comparison circuitry 108 arranged between a first voltage/power supply rail (AVDD) 130 and a second voltage/power supply rail (AVSS) 136. The comparison circuitry 108 includes an input stage 102, an output stage 110, a first current source 116, and an RC circuit 124. The RC circuit includes a first resistor R1 and capacitor C1. A SET protection circuit 120 is coupled to the input stage 102 of the comparison circuitry 108. The SET protection circuit 120 is also arranged between the first voltage/power supply rail (AVDD) 130 and the second voltage/power supply rail (AVSS) 136, and thus constitutes a separate current path from the comparison circuitry 108.

The input stage 102 includes a first pair of transistors 104 and 106, which are illustrated for example as p-channel metal oxide semiconductor (PMOS) transistors. The first pair of transistors 104 and 106 each include a first terminal, a second terminal, a gate terminal, and a body terminal. The output stage 110 includes a second pair of transistors 112 and 114, which are illustrated for example as n-channel MOS (NMOS) transistors. The second pair of transistors 112 and 114 can each include a first terminal, a second terminal, a gate terminal, and a body terminal. In some examples, transistor 104 may be referred to as a first transistor, transistor 106 may be referred to as a second transistor, transistor 112 may be referred to as a third transistor, and transistor 114 may be referred to as a fourth transistor.

The SET protection circuit 120 includes a second current source 118, transistor 122, and second resistor R2. The second current source 118 includes a first terminal coupled to AVDD 130 and a second terminal coupled to AVSS 136. The transistor 122, which is illustrated as a PMOS transistor, includes a first terminal, a second terminal, a gate terminal, and a body terminal. In some examples, transistor 122 may be referred to as a fifth transistor. The second resistor R2 includes a first terminal coupled to the second terminal of transistor 122 and a second terminal coupled to AVSS 136.

In the input stage 102, the gate terminals of the first pair of input transistors 104 and 106 are coupled to the first and second input terminals 103 and 105 (VIN and VIP) of the comparator 101, respectively. The first terminals of the first pair of transistors 104 and 106 are each coupled to a second terminal of the first current source 116. The body terminals of the pair of differential input transistors 104 and 106 are coupled together and are coupled to the second terminal of the second current source 118. The second terminals of the pair of differential input transistors 104 and 106 are coupled to the second terminals of the pair of transistors 112 and 114 of the output stage 110, respectively. The first terminal of the first current source 116 is coupled to the first voltage/power supply rail 130.

In the output stage 110, the gate terminals of the second pair of transistors 112 and 114 are coupled together, are coupled to the second terminal of the transistor 112 of the output stage 110, and are coupled to the second terminal of the first transistor 104. The second terminal of transistor 114 is coupled to the output terminal 107 and is also coupled to the second terminal of the second transistor 106 of the input stage. The first terminals of the second pair of transistors 112 and 114 are coupled to the second voltage/power supply rail AVSS 136. The body terminals of the second pair of transistors 112 and 114 are coupled to the first terminals of the pair of differential input transistors 112 and 114.

Figure 9:
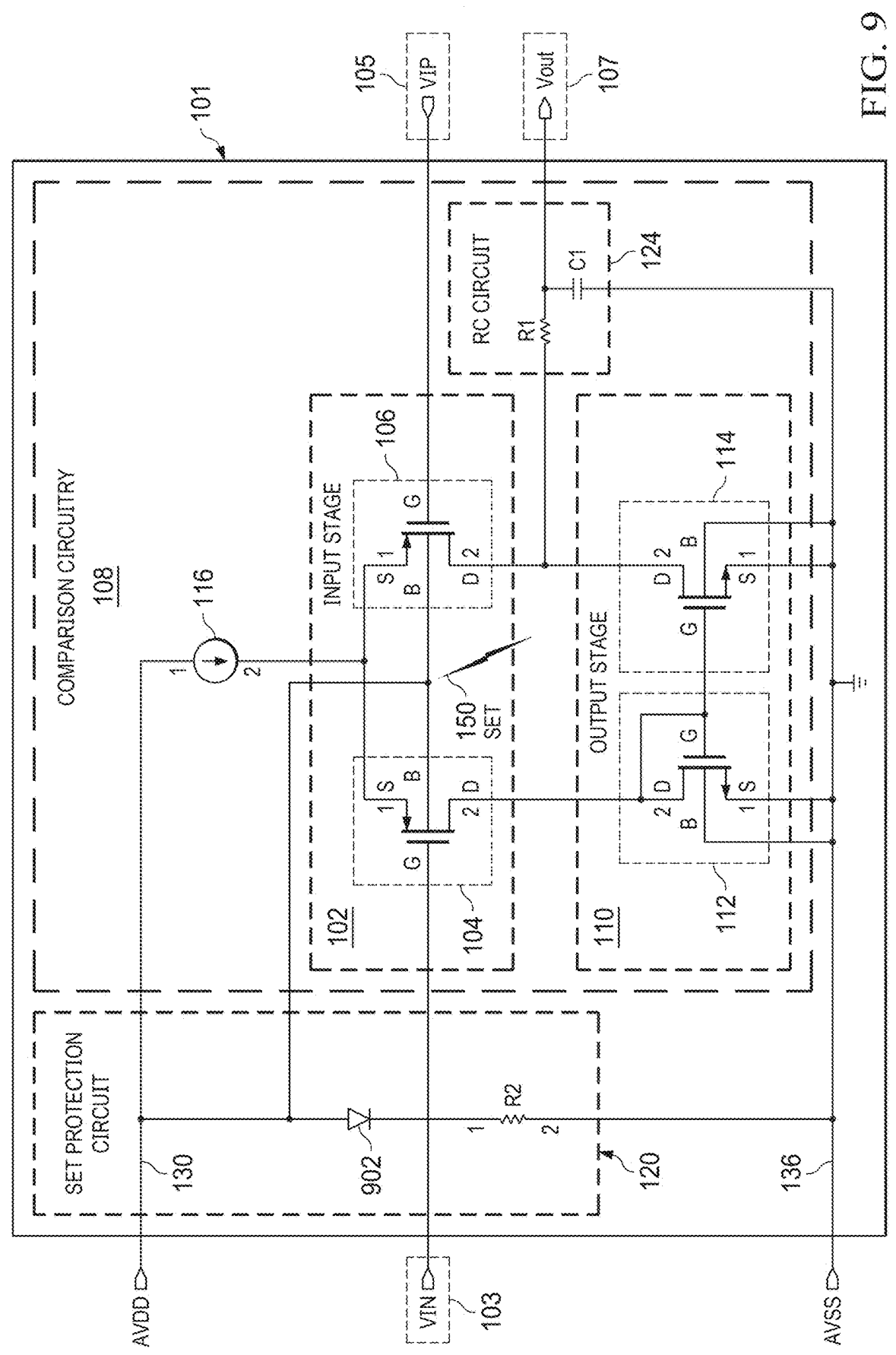
FIG. 9 is a circuit schematic of comparator that includes a SET protection circuit in accordance with some examples.
Figure 10:
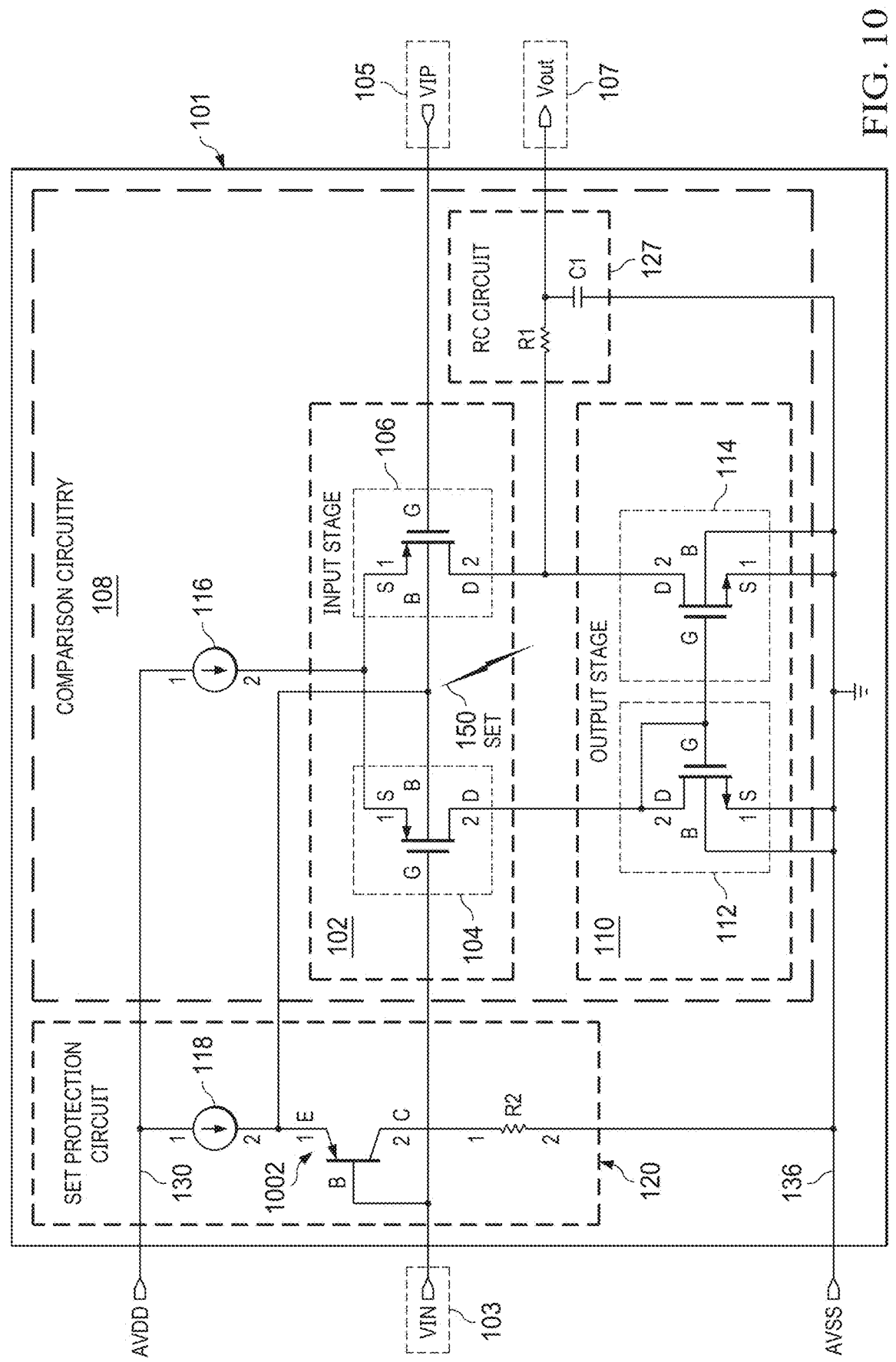
FIG. 10 is a circuit schematic of comparator that includes a SET protection circuit in accordance with some examples.

In the SET protection circuit 120, the first terminal of the second bias current 118 is coupled to of the first voltage/power supply rail AVDD 130. The first terminal of the transistor 122 is coupled to the second terminal of the second bias current 118 and is coupled to the body terminals of the pair of differential input transistors 104 and 106 of the input stage 102. The first terminal of the transistor 122 is also coupled to the body terminal of the transistor 122 of the SET protection circuit 120. The gate terminal of the transistor 122 is coupled to the gate of differential input transistor 104 of the input stage 102 and is coupled to the first input terminal 103 of the comparator 101. The body terminal of the transistor 122 is coupled to the body terminals of the first terminals of the differential input transistors 104 and 106 of the input stage 102. The second terminal of transistor 122 is coupled to the first terminal of the second resistor R2. In addition, the second terminal of the second resistor R2 is coupled to the second voltage/power supply rail AVSS 136. In other examples, such as shown in FIGS. 9-10, the transistor 122 could be replaced by a diode 902 (see FIG. 9), such as a p-n diode or Schottky diode, or could be replaced by another type of transistor such as a bipolar junction transistor 1002 (see FIG. 10). Other circuits are also possible. These other alternatives may offer different levels of efficiency than a MOSFET, and these other alternatives may still offer better performance than previous approaches.

Figure 3:
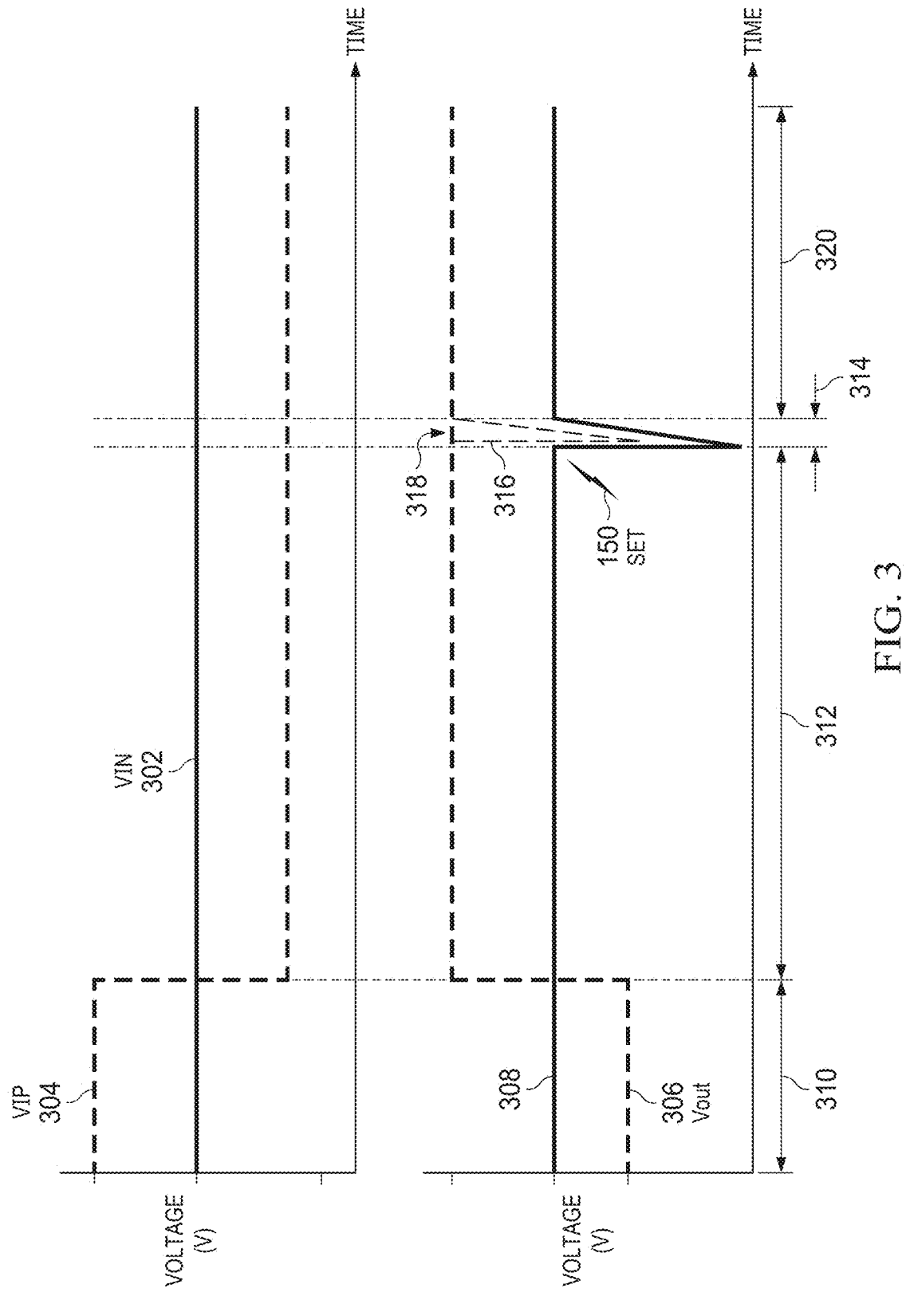
FIG. 3 depicts waveforms of a comparator in accordance with some examples.

An example of operation of the comparator 101 is now described with regards to FIGS. 2-3 concurrently. FIG. 3 depicts some examples of first input voltage (VIN) 302 on first input terminal 103, second input voltage (VIP) 304 on second input terminal 105, and output voltage (Vout) 306 on output terminal 107. Body bias voltage 308 on the body terminals of transistors 104, 106, and 122 is also shown.

In FIG. 3 during time 310, the first input voltage VIN 302 is lower than the second input voltage VIP 304 (e.g., VIN is about 1 Volts and VIP is about 3 Volts). Thus, during time 310, VIN being low provides a low gate voltage to PMOS transistor 104, thereby turning transistor 104 "on" (meaning there is a conductive pathway between source and drain of transistor 104); and VIP being high on 105 provides a high gate voltage to PMOS transistor 106, thereby turning transistor 106 "off" (meaning there is a high impedance and/or a lack of a conductive channel between source and drain of transistor 106). Consequently, because transistor 104 is "on", the second terminal (e.g., drain) of transistor 112 is pulled up toward AVDD 130, which applies a high voltage to the control terminals (e.g., gates) of NMOS transistors 112, 114. Thus, NMOS transistor 112 is "on", and current from first current source 116 is directed through transistors 104 and 112. Moreover, because NMOS transistor 114 also has a high voltage on its gate, NMOS transistor 114 is also "on" while transistor 106 is "off", which pulls charge that was stored on capacitor C1 to AVSS 136. Therefore, during time 310, the output voltage 306 on output terminal 307 is low, which corresponds to a first comparison result. Thus, when VIP is greater than VIN, Vout is low and the comparator 101 returns on output of "0".

During time 312, the second input voltage VIP 304 drops lower than the first input voltage VIN 302 (e.g., VIP is about 0 Volts and VIN is about 1 Volts). Thus, during time 312, PMOS transistor 106 is conducts more current than PMOS transistor 104, and more current from first current source 116 is directed through transistor 106 than transistor 104. Consequently, because nominal current is going through transistors 104 and 112, the gate voltage of transistor 112 drops down so transistors 112 and 114 are "off"; and the current passing from first current source 116 through transistor 106 is steered onto capacitor C1. Thus, a large voltage builds up on capacitor C1 due to the incoming current through 106. During 312, the output voltage 306 goes high, which corresponds to a second comparison result. Thus, when VIP is less than VIN, Vout is high and the comparator 101 returns on output of "1". In this way, during normal operation, the output voltage 306 on output terminal 107 of the comparator 101 can output a comparison result that varies between a low voltage (e.g., during time 310) and a high voltage (e.g. during time 312) depending on the relationship between the first and second voltages 302, 304 on the first and second input terminals 103, 105, respectively.

As appreciated in some aspects of the present description, in some circumstances a SET 150 may strike a body terminal of one or both input transistors 104, 106. See e.g., time 314 in FIG. 3. In previous approaches, such a SET could ripple through the input transistors and cause a brief, unexpected "dip" or "spike" at the output terminal 107 of the comparator (see e.g., dashed line 316 in FIG. 3). This unexpected "dip" or "spike" could propagate through downstream circuitry, and ultimately cause system errors in the system. In contrast, in the comparator 101, part of the power of the SET 150 goes into the body terminals of the transistors 104, 106, 122, which in turn changes the voltage threshold of the transistors 104, 106, 122 according to the body bias effect. The body bias effect is caused by a voltage difference between a transistor's source and body, and can increase or decrease the threshold voltage of the transistor. Another part of the power of the SET 150 is diverted out through the SET protection circuit 120 to AVSS 136. More particularly, for example, if a high-voltage SET 150 strikes the body of transistors 104, 106, 122, the high-voltage also is seen at the source of transistor 122. At this point, when VIN on 103 is low, transistor 122 is "on", meaning there is a conductive pathway between source and drain of transistor 122, and the power of the SET 150 passes down through R1 to AVSS 136. Thus, even when a SET 150 strikes the body of input transistors 104, 106, the output terminal 107 remains substantially un-affected by the SET 150, and can have, for example, less than a 1% change in its output voltage level responsive to the SET 150 (see e.g., waveform 318). Further, even if a SET strikes when VIP on 105 is low, the output on 107 is still driven high due to current from 106 charging capacitor C1, so proper comparator functionality is still realized. After the SET passes, normal operation continues at time 320.

By making use of the SET protection circuit 120, the comparator 101 can realize reliable functionality with only a single instantiation of the comparator 101. Therefore, this comparator 101 eliminates the need for multiple comparators and voting circuitry to provide protection against SETs. As such, this comparator 101 provides a smaller footprint than previous approaches, meaning this comparator 101 can be cheaper to produce than previous approaches. In addition, because comparator 101 includes less circuitry than previous approaches, it also provides reduced power consumption relative to previous approaches; and can thereby enable more functionality for space craft where limiting power consumption is an important concern.

In some examples, all circuit elements of the comparator 101 can be arranged on a single integrated circuit (e.g., a single monocrystalline silicon substrate or a single silicon on insulator substrate). In other examples, all circuit elements of the comparator 101 can be spread over multiple integrated circuit die stacked over one another and/or adjacent to one another in a packaged integrated circuit, such as a so-called three-dimensional integrated circuit package. In still other examples, at least some circuit elements of the input stage 102, the output stage 110, the SET protection circuit 120, the resistors R1, R2, capacitor C1, the first current source 116, and/or the second current source 118 can be discrete components that can be arranged on a printed circuit board (PCB), and can be operably coupled to one another by conductive traces on the PCB. In still other examples, the illustrated components of FIG. 2 can be divided other ways among multiple integrated circuits and/or discrete devices.

Figure 7:
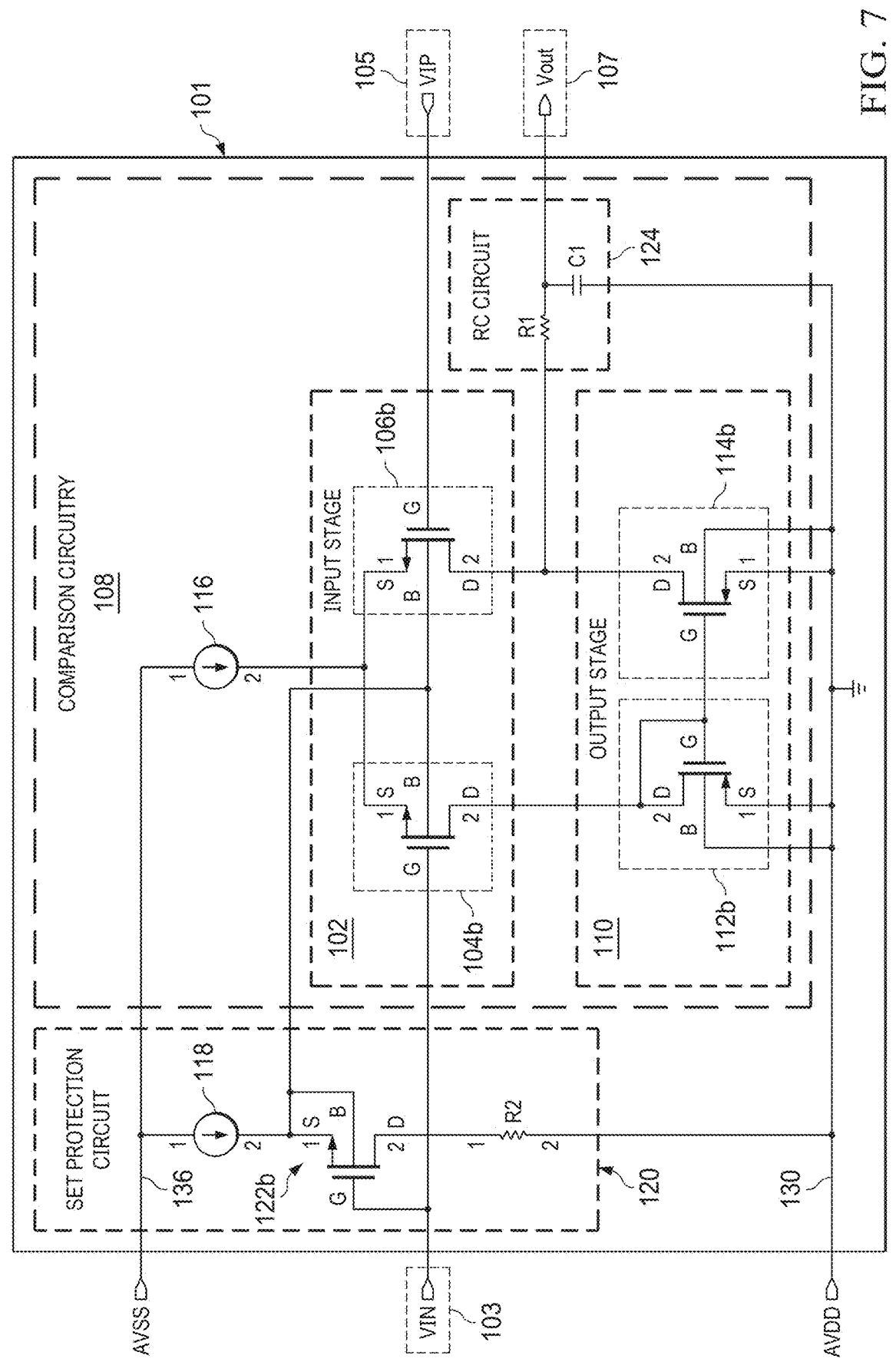
FIG. 7 is a circuit schematic of another comparator, which has a complementary logic design relative to the comparator of FIG. 1.

In the illustrated example, the transistors are illustrated as metal oxide semiconductor field effect transistors (MOSFETs). MOSFETs tend to provide lower power consumption than some other approaches. Thus, in the illustrated example of FIG. 2, transistors 112 and 114 are N-channel metal oxide semiconductor (NMOS) transistors, and transistors 104, 106, and 122 are P-channel metal-oxide semiconductor (PMOS) transistors. Further, in the illustrated example, each "first terminal" for these transistors may be a source terminal, for example, while each "second terminal" may be a drain terminal. In other examples, such as illustrated in FIG. 7 for example, a complementary implementation can be used where N-type transistors (e.g., 112 and 114 of FIG. 2) may be replaced with PMOS transistors 112b, 114b, and PMOS transistors (e.g., 104, 106, and 122 of FIG. 2) may be replaced with NMOS transistors 104b, 106b, and 122b, such that each "first terminal" of the transistors may be a drain terminal and each "second terminal" of the transistors may be a source terminal.

Figure 4:
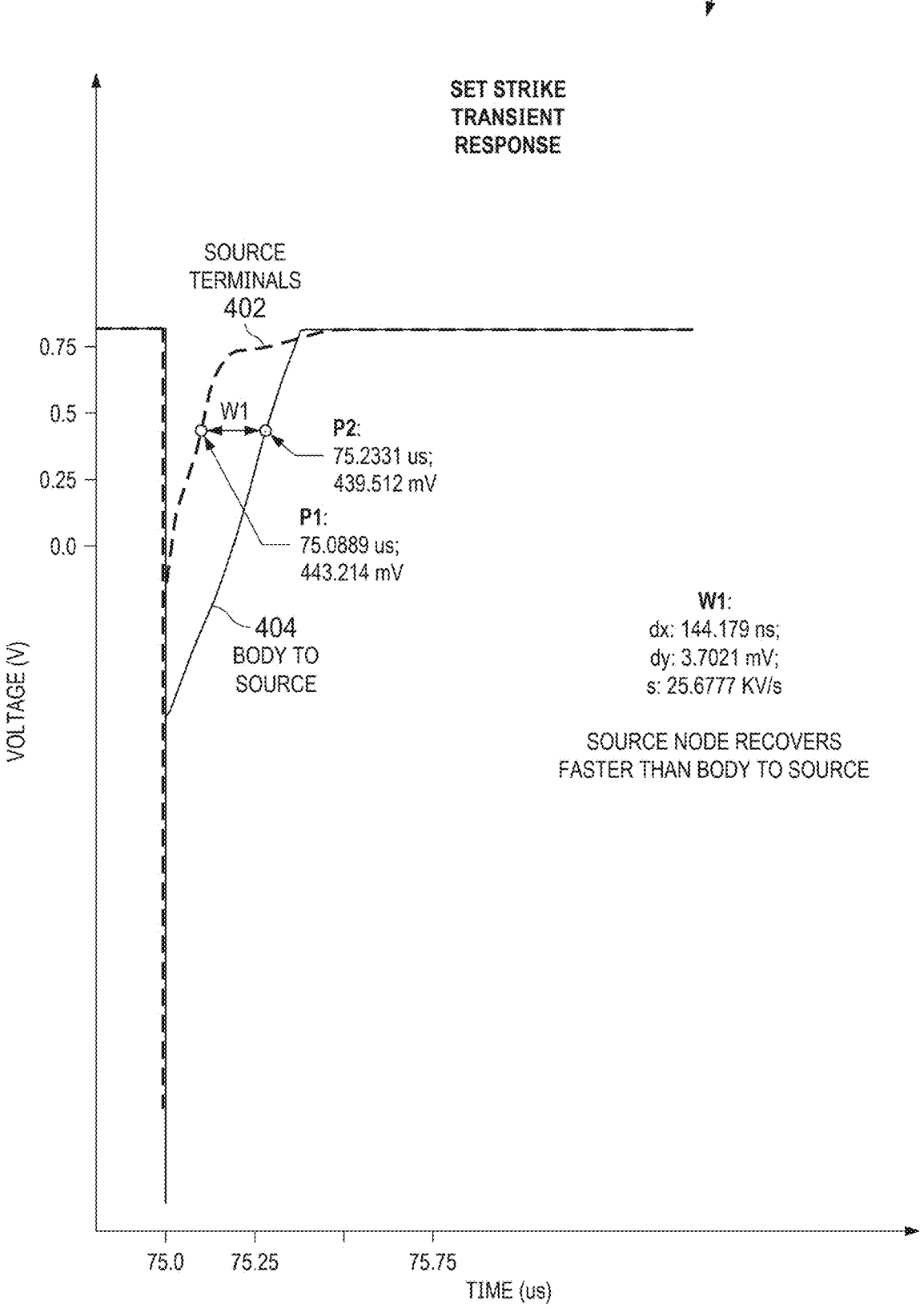
FIG. 4 depicts waveforms of a comparator in accordance with some examples.

FIG. 4 illustrates other examples of waveforms 400 of different comparator configurations at first terminals of a comparator responsive to a SET strike at body terminals of an input stage of the comparator. Waveform 402 is a voltage signal at the first terminals of the input stage 102 of comparator 101. Waveform 404 is a voltage signal at the first terminals of a comparator configuration where the source terminals are being shorted to the body terminals of an input stage, and as described above without the SET protection circuit being operably coupled to the input stage. As described in this description, the first terminals of the input stage can be source terminals, for example; alternatively, the first terminals can be drain terminals where the input stage comprises NMOS transistors rather than PMOS transistors.

Waveform 402, for example, demonstrates the voltage signal at the first terminals of the input stage 102 of FIG. 2 responsive to a SET strike at the body terminals of the input stage 102 of the comparator 101 sampled at point 1 (P1) measuring 443.214 mV at 75.0889 us. Waveform 404, for example, demonstrates the voltage signal at the first terminals of an input stage responsive to a SET strike at the body terminals of an input stage for a comparator configuration sampled at point 2 (P2) measuring 439.512 mV at 752331 us. Both waveforms 402 and 404 are responsive to a SET strike at the body terminals of an input stage at about 75.00 us. As shown, the source terminals measured at the first terminals of comparator 101 in waveform 402 recovers faster than the alternative comparator configuration in waveform 404, where a width (W1) or difference between P1 and P2 measures 144 nanoseconds (ns) along the horizontal (time) axis and 3.7021 millivolts (mv) along the vertical (voltage) axis. Thus, the comparator 101 recovers at the first terminals faster than without the SET protection circuit 120 operably coupled to body terminals of the input stage 102 when the body terminals of the input stage are shorted to the first terminals of the input stage and the SET protection circuit 120 is not being operably coupled to body terminals of the input stage 102. Consequently, the first terminals (e.g., source terminals) of the input stage 102 recover to a steady state voltage faster from a SET strike at the body terminals of the input stage 102 due to the SET protection circuit 120 biasing the body terminals of the input stage 102 independently from the first terminals of the input stage 102. Because the SET protection circuit 120 decouples the body terminals of the input stage 102 from the first terminals of the input stage, and independently biases the body terminals from the first terminals, the effect of the SET strike at the first terminals is less pronounced, making the comparator 101 fault tolerant in orbital atmospheres of space and radiation-hardened to provide a continuous output, with less die area, a lower cost, less complexity, and greater cost efficiency for space applications.

Figure 5:
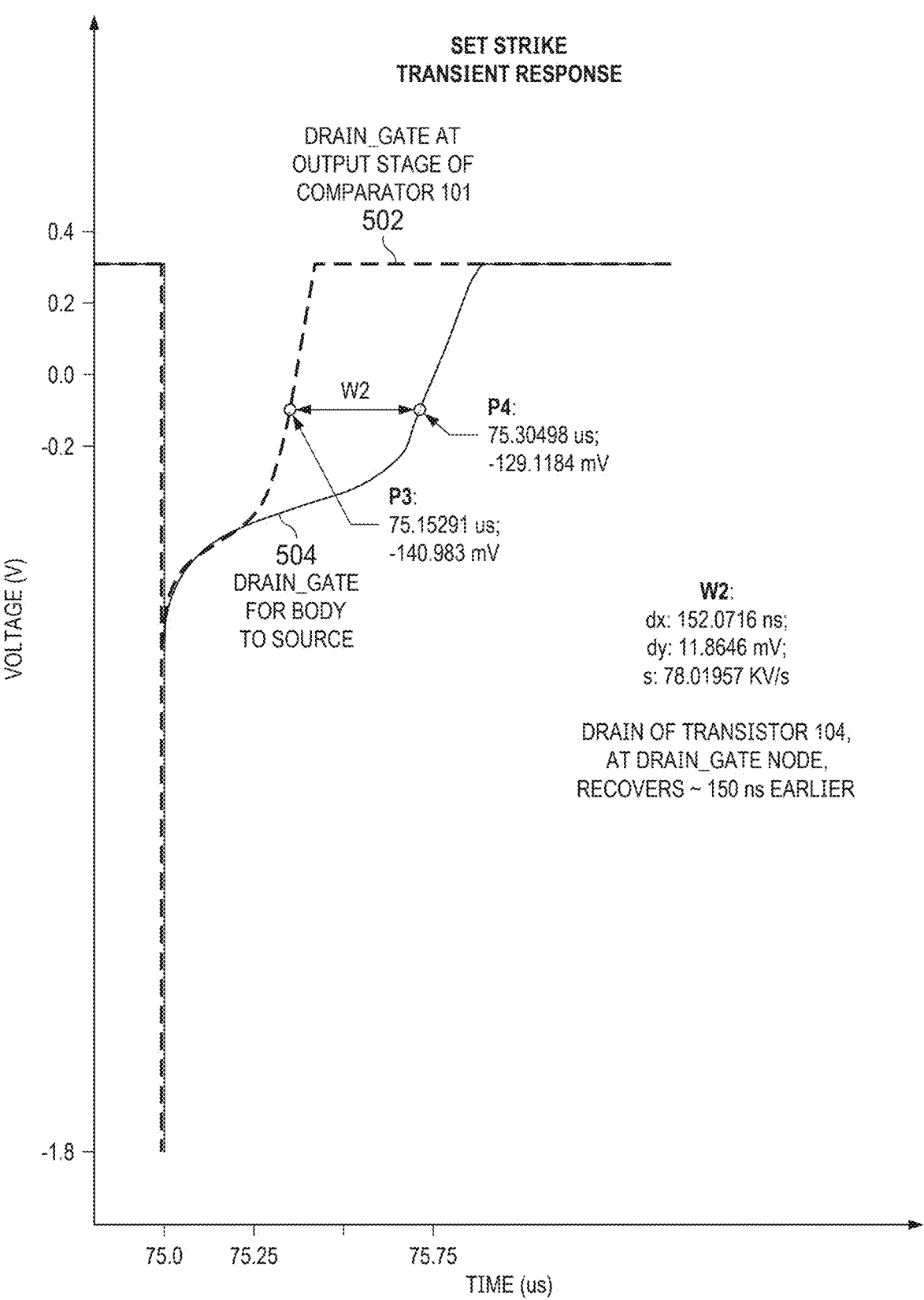
FIG. 5 depicts waveforms of a comparator in accordance with some examples.

FIG. 5 illustrates further examples of waveforms of different comparator configurations at a second terminal of an output stage responsive to a SET strike at body terminals of an input stage of the comparator. Waveform 502 is a voltage signal at a second terminal of the input stage 102 of comparator 101, specifically at the DRAIN_GATE terminals at the output stage 110 of FIG. 1. Waveform 504 is a voltage signal at a second terminal of a comparator configuration where the source terminals are being shorted to the body terminals of an input stage, and as described above without the SET protection circuit being operably coupled to the input stage, similarly as with waveform 404 of FIG. 4. As described in this description, the second terminals of the input stage can be drain terminals, for example; alternatively, the second terminals can be source terminals where the input stage comprises NMOS transistors rather than PMOS transistors.

Waveform 502, for example, demonstrates the voltage signal at the DRAIN_GATE terminals at the output stage 110 of FIG. 1 responsive to a SET strike at the body terminals of the input stage 102 of the comparator 101 sampled at point 3 (P3) measuring −140.983 mV at 75.15291 us. Waveform 504, for example, demonstrates the voltage signal at DRAIN_GATE terminals at an output stage responsive to a SET strike at the body terminals of an input stage for a comparator configuration sampled at point 4 (P4) measuring −129.1181 mV at 75.30498 us. Both waveforms 502 and 504 are responsive to a SET strike at the body terminals of an input stage at about 75.00 us. As shown, the DRAIN_GATE terminals of the comparator 101 in waveform 502 recovers earlier than the alternative comparator configuration at DRAIN_GATE terminals in waveform 504, where a width (W2) or difference between P3 and P4 measures 152.0716 nanoseconds (ns) along the horizontal (time) axis and 11.8646 mv along the vertical (voltage) axis. Because the body terminals are decoupled from the first terminals of the differential pair of transistors 104 and 106, the comparator 101 recovers at the DRAIN_GATE terminals faster than without the SET protection circuit 120 being operably coupled to body terminals of the input stage 102 and decoupling the body terminals from the first terminals of the input stage 102.

Figure 6:
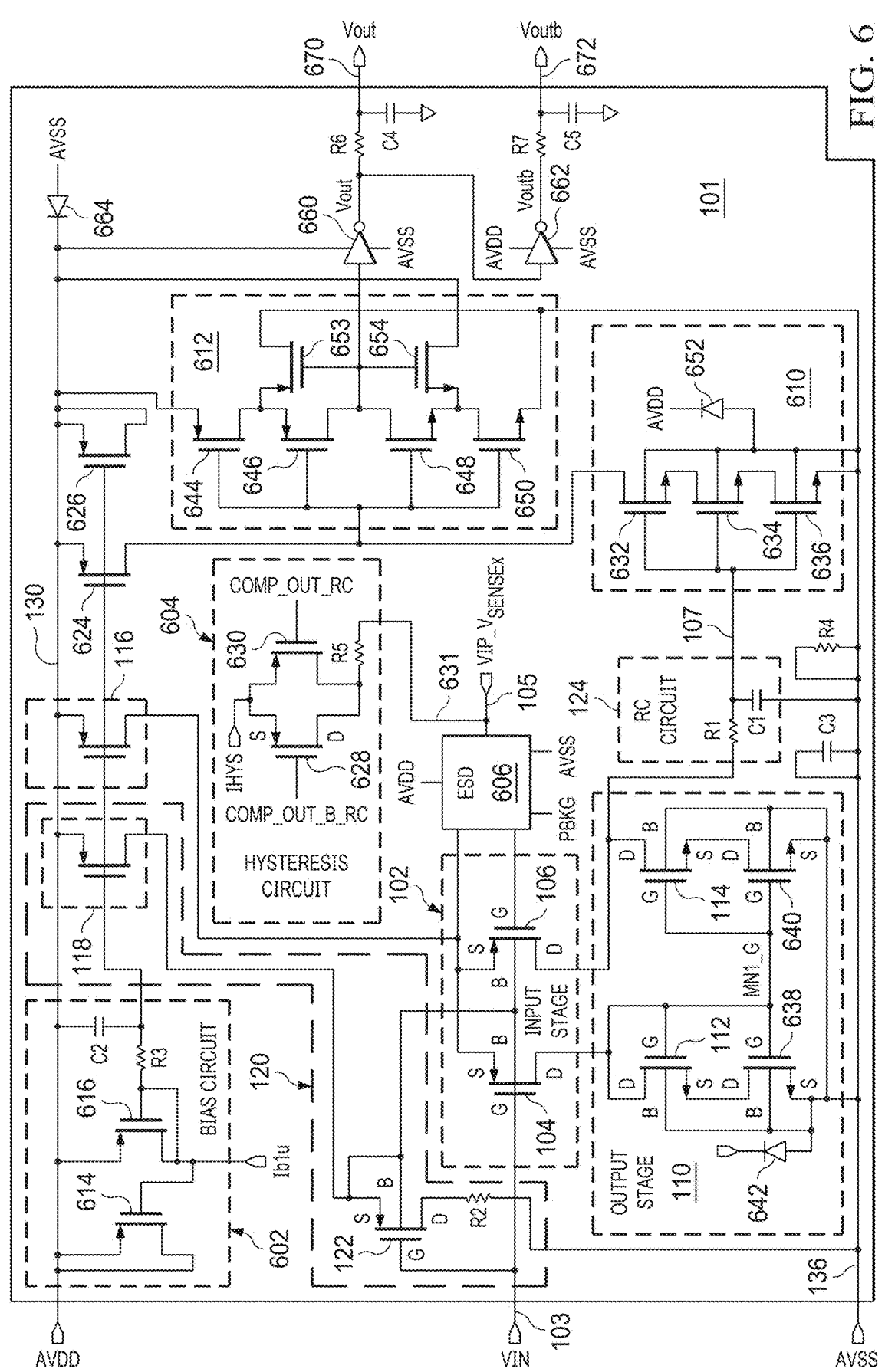
FIG. 6 is a more detailed circuit schematic of comparator that includes a SET protection circuit in accordance with some examples.

FIG. 6 illustrates another example of the comparator 101. As illustrated and described in FIG. 1, the comparator 101 includes a first input terminal 103, a second input terminal 105, an output terminal 107. The comparator 101 also includes an input stage 102, an output stage 110, an RC circuit 124, and a SET protection circuit 120, which are operably coupled between the first and second voltage/power supply rails 130 and 136.

The comparator 101 further includes a bias circuit 602, a hysteresis circuit 604, an electrostatic discharge (ESD) circuit 606, a protection circuit 610, and a Schmitt trigger circuit 612, and a differential output including Vout 670 and Voutb 672. The comparator 101 further includes resistors R1, R2, R3, R4, R5, R6, and R7, capacitors C1, C2, C3, C4, and C5, diodes 642, 652 and 664, and inverters 660 and 662, for example.

The output stage 110 includes further circuitry such as a third pair of transistors 638 and 640, including a sixth transistor 638 and a seventh transistor 640, and the diode 642. The third pair of transistors 638 and 640 have first terminals, second terminals, body terminals and gate terminals. The second terminals of the third pair of transistors 638 and 640 coupled to the first terminals of the second pair of transistors 112 and 114 of the output stage 110. First terminals and body terminals of the third pair of transistors 638 and 640 are coupled to the diode 642 (e.g., a rectifier diode). The diode 642 is coupled is configured to have a SET isolation current thereat. The first terminals of the third pair of transistors 638 and 640 are also coupled to the second voltage/power supply rail 136, and to the body terminals of the transistors 112, 114, 638 and 640. The gate terminals of the transistors 112, 114, 638 and 640 are coupled to one another, and further coupled to the second terminal of the transistors 112 of the output stage 110 and the second terminal of transistor 104 of the input stage 102.

Similar to FIG. 2, the SET protection circuit 120 includes the second current source 118, transistor 122, and resistor R2 coupled in series between the first and second voltage/power supply rails 130 and 136. The input stage 102 and the output stage 110 are coupled on a second path in series with the first current source 116 and parallel to the first path.

The bias circuit 602 includes transistors 614 and 616, a resistor R3 and capacitor C2. Transistors 614 and 616 include first terminals, second terminals and control terminals. The first terminals of transistors 614 and 616 are coupled to one another and to the first voltage/power supply rail 130. The second terminals of transistors 614 and 616 are coupled to one another, and the control terminals of transistors 614 and 616 are coupled to one another. The control terminals of the transistors 614 and 616 are further coupled to the resistor R3. The capacitor C2 is coupled to the resistor R3 and to the first voltage/power supply rail 130 as a low pass filter for filtering high frequency signals. A bias current Ib-1u (e.g., about one micro-amp) is coupled the gate terminals of transistors 614 and 616.

The comparator 101 further includes transistors 624 and 626, and diode 664. Transistors 624 and 626 can comprise same or different aspects ratios, for example. Transistors 624 and 626 include first terminals, second terminals and gate terminals. Transistor 624 further includes a body terminal. The second terminal of transistor 624 is coupled to the protection circuit 610 and to the Schmitt trigger circuit 612. The body terminal of transistor 624 is coupled to the gate terminal of transistor 626. The second terminal of transistor 626 is further coupled to the first voltage/power supply rail 130. Although the transistors 614, 616, 624 and 626 are illustrated and described as PMOS transistors, alternatively they can be NMOS transistors.

The hysteresis circuit 604 includes a resistor R5, transistors 628 and 630, and an output 631. A first terminal of transistor 628 is coupled to a second terminal of transistor 630, and a second terminal of transistor 628 is coupled to a first terminal of transistor 630. The second terminal of transistor 628 and the first terminal of transistor 630 are coupled to a first terminal of resistor R5. A second terminal of resistor R5 is coupled to the output 631. The gate terminals of transistors 628 and 630 are coupled to voltages that can be set by the outputs of the comparator 101 as a first input (Comp_Out) and a second input (Comp_B_OUT_RC). A hysteresis bias current IHYS (e.g., about 24 micro amps) is coupled to the first terminal of transistor 628 and the second terminal of transistor 630. The transistor 628 can be configured as a PMOS transistor, while the transistor 630 can be configured as an NMOS transistor. Alternatively, the transistor 628 can be an NMOS transistor and the transistor 630 can be a PMOS transistor.

The hysteresis bias current IHYS can be mirrored internally across the second input terminal 105 of the comparator 101 as a sense input. The hysteresis bias current IHYS can become active when the voltage at the second input terminal 105 becomes greater than a threshold voltage (e.g., 599 mV). The hysteresis bias current IHYS multiplied by the resistor R5 can be added to the voltage at the second input terminal 105, effectively boosting (incrementing) the voltage at an input node of the second input terminal 105.

The ESD circuit 606 includes a first terminal, a second terminal, a third terminal, a fourth terminal, a fifth terminal and a sixth terminal. The first terminal of the ESD circuit 606 is coupled to the first terminals of the transistors 104 and 106 of the input stage 102. The second terminal of the ESD circuit 606 is coupled to the gate terminal of the second transistor 106 of the input stage 102, and the third terminal of the ESD circuit 606 is coupled to the second input terminal 105 of the comparator 101 and to the output 631 of the hysteresis circuit 604. The fourth terminal of the ESD circuit 606 is coupled to the voltage/power supply AVDD

130, and the fifth terminal of the ESD circuit 606 is coupled to the voltage/power supply AVSS 136. The sixth terminal (e.g., PBKG) can be coupled to a substrate (not shown) for dissipating ESD current.

The RC circuit 124 includes resistor R1 and capacitor C1. Because the SET protection circuit 120 is configured to decouple the body terminals from other terminals of transistors 104 and 106 of the input stage 102, less RC circuitry can be employed without excessively affecting the propagation delay of the comparator 101 or slowing down a response time of the comparator 101. For example, the RC circuit 124 can comprise an RC constant having a resistance up to 100 kilo-ohm and a capacitance up to 500 femto-farads (fF).

The protection circuit 610 can include transistors 632, 634, 636, and the diode 652. The transistors 632, 634 and 636 comprise first terminals, second terminals, gate terminals, and body terminals, respectively. The second terminal of transistor 632 is coupled to the second terminal of transistor 624 and to the Schmitt trigger circuit 612. The first terminal of transistor 632 is coupled to the second terminal of transistor 634. The first terminal of transistor 634 is coupled to the second terminal of 636. The first terminal of transistor 636 is coupled to the second voltage/power supply rail 136. The gate terminals of the transistors 632, 634 and 636 are coupled to the RC circuit 124 and to one another. The body terminals of the transistors 632, 634 and 636 are coupled to one another and to the first terminal of transistor 636. The protection circuit 610 can be configured to protect the comparator 101 from a voltage exceeding a threshold, for example. Although the transistors 632, 634 and 636 are illustrated and described as NMOS transistors, alternatively they can be PMOS transistors.

The Schmitt trigger circuit 612 includes transistors 644, 646, 648, 650, 653 and 654, including a first terminal, a second terminal, and a gate terminal, respectively. The first terminal of the transistor 644 is coupled to the first voltage/power supply rail 130. The second terminal of transistor 644 is coupled to the first terminals of transistor 646 and 653. The second terminal of transistor 646 is coupled to the second terminal of transistor 648 and to the gate terminals of transistors 653 and 654. The first terminal of transistor 648 is coupled to the second terminal of transistor 650 and the second terminal of transistor 654. The first terminal of transistor 654 is coupled to the first voltage/power supply rail 130. The first terminal of transistor 650 is coupled to the second terminal of transistor 653. The gate terminals of transistors 644, 646, 648 and 650 are coupled to one another and to the second terminals of transistor 624 and the transistor 632 of the protection circuit 610.

In one example, the transistors 648, 650 and 654 of the Schmitt trigger circuit 612 may be configured to be NMOS transistors, and the transistors 644, 646, and 653 can be configured to be PMOS transistors. In another example, the transistors 648, 650 and 654 may be configured to be PMOS transistors, and the transistors 644, 646, and 653 can be configured to be NMOS transistors.

Inverter 660 includes an input, an output, a first terminal and a second terminal. The input of the inverter 660 is coupled to the gate terminals of transistor 653 and transistor 654 of the Schmitt trigger circuit 612, and to the second terminals of transistors 646 and 648 of the Schmitt trigger circuit 612. The first terminal of the inverter 660 is coupled to the first voltage/power supply rail 130. The second terminal of the inverter 660 is coupled to a voltage AVSS of the second voltage/power supply rail 136. The output of the inverter 660 is coupled to the resistor R6.

Inverter 662 includes and input, an output, a first terminal and a second terminal. The input of the inverter 662 is coupled to the output of inverter 660. The first terminal of the inverter 662 is coupled to a voltage AVDD of the first voltage/power supply rail 130. The second terminal of the inverter 662 is coupled to a voltage AVSS of the second voltage/power supply rail 136. The output of the inverter 662 is coupled to the resistor R7.

The resistors R6 and R7 include first and second terminals, respectively. The first terminals of resistors R6 and R7 are coupled to outputs of inverters 660 and 662, respectively. The second terminals of resistors R6 and R7 are coupled to differential outputs and including Vout 670 and Voutb 672, respectively. The second terminals of resistors R6 and R7 are further coupled to capacitors C4 and C5, respectively. Capacitors C4 and C5 are further coupled to a ground.

Figure 8:
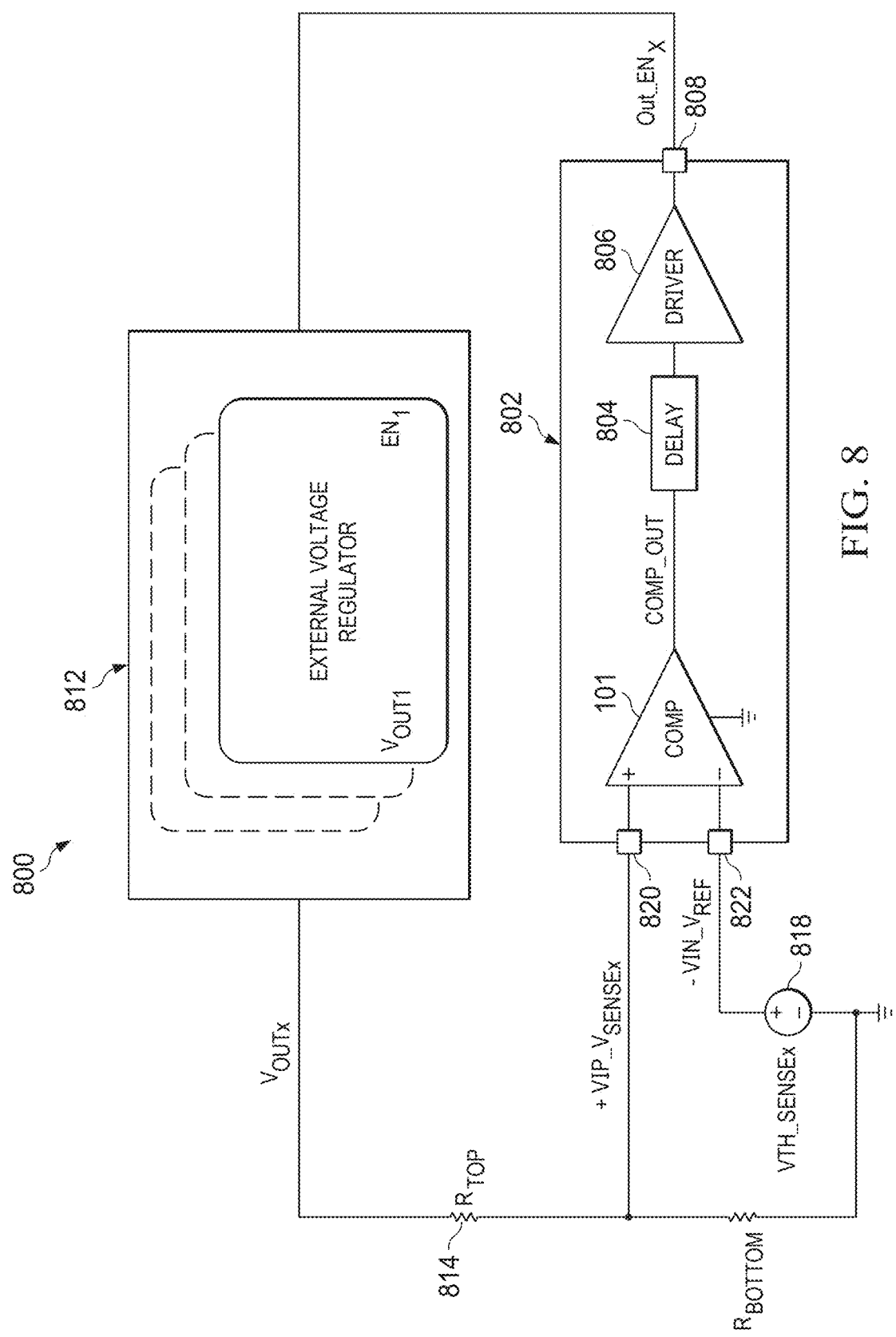
FIG. 8 is a system that includes a comparator in accordance with some examples.

FIG. 8 illustrates an example of a system 800 having comparator 101. The system 802 can be integrated on a chip or a die to ensure proper voltage level sequencing of one or more external loads for space applications. The system 802 includes the comparator 101, a delay component 804, and a driver circuit 806, for example. The system 802 further includes a differential input that comprises a first pin 820 and a second pin 822. The first pin 820 is configured to receive a sensing voltage (VIP) at an input (e.g., a positive input), and the second pin 822 is configured to receive a reference voltage (VREF) with a threshold voltage. The comparator 101 compares the two input signals at the pins 820 and 822, and provides an output signal (COMP_OUT) based on the two input signals. When the comparator 101 is functioning properly, if the first input signal at the first input pin 820 is less than or equal to the second input signal at the second pin 822, then the output is in a first state (e.g., a logical "0"). Conversely, when the comparator 101 is functioning properly, if the first input signal is greater than the second input signal, then the output is in a second state (e.g., a logical "1").

The delay component 804 can operate as a programmable timer for sequencing up and down delays, sequencing up time to regulation, or reverse order sequence down processes for one or more voltage/power supply rails (e.g., first voltage/power supply rail 130). A threshold voltage and hysteresis current can provide programmable rise and fall monitoring voltages. The delay component 804 can provide timing by tracking the rising voltage on the sensing voltage (e.g., VSENSEx), for example. During a power on of the comparator 101, when the sense voltage at the first input pin 820 is above the reference voltage at the second pin 822 for a certain period of start-up time of the timer during sequence up, the output pin 808 can provide an output signal (OUT_ENx) being asserted high once the delay timer set is expired. Likewise, the same can be true for a sequence down once the VSENSEx is below the off voltage, the output signal (OUT_ENx) can be asserted low once a delay timer is expired.

The driver circuit 806 is coupled to the delay component 804 and the output pin 808. The driver circuit 806 provides an output signal at the output terminal 808 to sequence a voltage to one or more external power supplies or voltage regulators 812. The output of the voltage regulators 812 can be measured based on the resistor RTOP 814 and reference voltage with a threshold sensing voltage 818 be provided at 822 by the resistor RBOTTOM.

The system 802 with the comparator 101 is configured as a fault tolerant sequencing chip that sequences up or down one or more of the external voltage regulators 812 based on measurements at the sensing output Vout. By hardening the comparator 101 to SET strikes at body terminals of the comparator input stage, any disruption threat from ionizing radiation particles can be mitigated according to the aspects and configurations described herein. The comparator 101 gives the system 800 an increased resistance to SET strikes for space applications in particular, makes the system 800 less complex, less costly and requires less substrate or die area consequently.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. In other cases, the devices described herein are "configurable to" perform a task or function, meaning that the hardware present in the device is suitable to be programmed after manufacturing to perform the function via firmware and/or software programming of the device, and the firmware and/or software is not included at the time of manufacture.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of that parameter. Modifications are possible in the described examples, and other implementations are possible, within the scope of the claims.

What is claimed is:

1. A circuit, comprising:
a first input;
a second input;
an output;
a first transistor including a first terminal, a second terminal, a gate terminal and a body terminal, the gate terminal of the first transistor coupled to the first input of the circuit;
a second transistor including a first terminal, a second terminal, a gate terminal and a body terminal, the body terminal of the second transistor coupled to the body terminal of the first transistor, the first terminal of the first transistor coupled to the first terminal of the second transistor, and the gate terminal of the second transistor coupled to the second input of the circuit;
a third transistor including a first terminal, a second terminal, and a control terminal, the second terminal of the third transistor coupled to the second terminal of the first transistor;
a fourth transistor including a first terminal, a second terminal, and a control terminal, the second terminal of the fourth transistor coupled to the second terminal of the second transistor and coupled to the output of the circuit; and
a fifth transistor including a first terminal, a second terminal, a gate terminal and a body terminal, the gate terminal of the fifth transistor coupled to the gate terminal of the first transistor, the first terminal of the fifth transistor coupled to the body terminal of the fifth transistor, coupled to the body terminal of the first transistor and coupled to the body terminal of the second transistor.

2. The circuit of claim 1, further comprising:
a first supply rail; and
a second supply rail, the first terminal of the fifth transistor coupled to the first supply rail and the second terminal of the fifth transistor coupled to the second supply rail, the first terminal of the first transistor and the first terminal of the second transistor coupled to the second supply rail, and the second terminal of the third transistor and the second terminal of the fourth transistor coupled to the second supply rail.

3. The circuit of claim 2, further comprising:
a first current source coupled to the first supply rail and coupled to the first terminal of the fifth transistor; and
a second current source coupled to the first supply rail, coupled to the first terminal of the first transistor and the first terminal of the second transistor.

4. The circuit of claim 3:
the first current source configured to bias the first terminal of the fifth transistor, the body terminal of the first transistor and the body terminal of the second transistor; and
the second current source configured to bias the first terminal of the first transistor and the first terminal of the second transistor independently from the first terminal of the fifth transistor, the body terminal of the first transistor and the body terminal of the second transistor.

5. The circuit of claim 1, wherein the second terminal of the third transistor is coupled to the body terminal of the third transistor, coupled to the gate terminal of the third transistor and coupled to the gate terminal of the fourth transistor.

6. The circuit of claim 1, further comprising:
an RC circuit coupled to the output of the circuit and the second terminal of the second transistor.

7. The circuit of claim 1, further comprising:
a hysteresis circuit having an input and an output, the output of the hysteresis circuit coupled to the first input of the circuit; and
an electrostatic discharge (ESD) circuit having a first terminal, a second terminal, and a third terminal, the first terminal of the ESD circuit coupled to the first terminal of the first transistor and the first terminal of the second transistor, the second terminal of the ESD circuit coupled to the gate terminal of the second transistor, and the third terminal of the ESD circuit coupled to the first input of the circuit and coupled to the output of the hysteresis circuit.

8. The circuit of claim 1, wherein the first transistor comprises a first P-channel metal-oxide semiconductor (PMOS) transistor, the second transistor comprises a second PMOS transistor, the third transistor comprises a first N-channel metal-oxide semiconductor (NMOS) transistor, the fourth transistor comprises a second NMOS transistor, and the fifth transistor comprises a third PMOS transistor.

9. The circuit of claim 1, wherein the first transistor comprises a first N-channel metal-oxide semiconductor (NMOS) transistor, the second transistor comprises a second NMOS transistor, the third transistor comprises a first P-channel metal-oxide semiconductor (PMOS) transistor, the fourth transistor comprises a second PMOS transistor, and the fifth transistor comprises a third NMOS transistor.

10. A circuit, comprising:
a differential input;
an output;
a first transistor including a first terminal, a second terminal, a gate terminal and a body terminal, the gate terminal of the first transistor coupled to the differential input of the circuit;
a second transistor including a first terminal, a second terminal, a gate terminal and a body terminal, the body terminal of the second transistor coupled to the body terminal of the first transistor, the first terminal of the first transistor coupled to the first terminal of the second transistor, and the gate terminal of the second transistor coupled to the differential input of the circuit;

a third transistor including a first terminal, a second terminal, and a gate terminal, the second terminal of the third transistor coupled to the second terminal of the first transistor;

a fourth transistor including a first terminal, a second terminal, and a gate terminal, the second terminal of the fourth transistor coupled to the second terminal of the second transistor and coupled to the output of the circuit; and a protection circuit having a transistor, the transistor of the protection circuit having a first terminal, a second terminal, a gate terminal and a body terminal, the first terminal of the transistor of the protection circuit coupled to the body terminal of the transistor of the protection circuit, coupled to the body terminal of the first transistor and coupled to the body terminal of the second transistor, the protection circuit configured to bias the body terminal of the first transistor and the body terminal of the second transistor independently from the first terminal of the first transistor and the first terminal of the second transistor.

11. The circuit of claim 10, further comprising:

a first current source coupled to the first terminal of the transistor of the protection circuit; and a second current source coupled to the first terminal of the first transistor and coupled to the first terminal of the second transistor.

12. The circuit of claim 10, further comprising:

a resistor having a first terminal and a second terminal, the first terminal of the resistor coupled to the second terminal of the transistor of the protection circuit, and the second terminal of the resistor coupled to the first terminal of the third transistor, coupled to the first terminal of the fourth transistor, and coupled to the gate terminal of the third transistor; and a diode coupled to the gate terminal of the third transistor, coupled to the gate terminal of the fourth transistor, coupled to the first terminal of the third transistor and coupled to the first terminal of the fourth transistor.

13. The circuit of claim 10, further comprising:

a delay component having an input and an output, the input of the delay component coupled to the output of the circuit; and a voltage regulator having an input and an output, the input of the voltage regulator coupled to the output of the delay component, and the output of the voltage regulator coupled to at least one terminal of the differential input of the circuit.

* * * * *